US012764882B2

(12) United States Patent
Eguchi

(10) Patent No.: US 12,764,882 B2
(45) Date of Patent: Oct. 13, 2026

(54) COVER COMPONENT AND ELECTRONIC DEVICE UNIT

(71) Applicant: CASIO COMPUTER CO., LTD., Tokyo (JP)

(72) Inventor: Hiroki Eguchi, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 78 days.

(21) Appl. No.: 18/845,630

(22) PCT Filed: Feb. 22, 2023

(86) PCT No.: PCT/JP2023/006405

§ 371 (c)(1),
(2) Date: Sep. 10, 2024

(87) PCT Pub. No.: WO2023/171381

PCT Pub. Date: Sep. 14, 2023

(65) Prior Publication Data

US 2025/0194034 A1 Jun. 12, 2025

(30) Foreign Application Priority Data

Mar. 11, 2022 (JP) ................................ 2022-037695

(51) Int. Cl.
*H05K 5/03* (2006.01)
*H05K 5/02* (2006.01)

(52) U.S. Cl.
CPC ............ *H05K 5/03* (2013.01); *H05K 5/0217* (2013.01)

(58) Field of Classification Search
CPC ...... H05K 5/03; H05K 5/0217; H05K 5/0221; A45C 11/003; G06F 1/1629;
(Continued)

(56) References Cited

U.S. PATENT DOCUMENTS 4,431,113 A * 2/1984 Sims, Jr. ................. H05K 5/03 220/784
4,942,271 A * 7/1990 Corsi .................. H02G 3/0418 174/101
(Continued)

FOREIGN PATENT DOCUMENTS

JP S63261898 A * 10/1988
JP H0659161 U 8/1994
(Continued)

OTHER PUBLICATIONS

Visions4 Magazine, https://visions4netjournal.com/page-twoa/ (Year: 2002).*

(Continued)

*Primary Examiner* — Rockshana D Chowdhury
*Assistant Examiner* — Martin Antonio Asmat Uceda
(74) *Attorney, Agent, or Firm* — Holtz, Holtz & Volek PC

(57) ABSTRACT

A cover component attachable to and detachable from an electronic device body includes a hook part and a protrusion. The hook part stands in a first direction and engages a recess provided in a lateral face of the electronic device body. The protrusion regulates a position of the electronic device body in the first direction by the protrusion and a rib being superposed when the cover component is attached to the electronic device body. The rib is provided adjacent to the recess in the lateral face of the electronic device body.

12 Claims, 4 Drawing Sheets

(58) Field of Classification Search
CPC .... G06F 1/1628; G06F 1/1633; G06F 1/1656; A45F 5/00; H04B 1/3888; H04M 1/02; H04M 1/0249; H04M 1/0252; H04M 1/7246
See application file for complete search history.

(56) References Cited

U.S. PATENT DOCUMENTS

| | | | | | |
|---|---|---|---|---|---|
| 5,308,941 | A * | 5/1994 | Hoh | H01R 12/714 | 200/290 |
| 8,164,885 | B2 * | 4/2012 | Lu | H01M 50/213 | 455/575.8 |
| 8,322,760 | B2 * | 12/2012 | Wu | H04M 1/0262 | 292/137 |
| 8,371,663 | B2 * | 2/2013 | Fujikawa | H04N 5/64 | 220/2.1 A |
| 8,917,519 | B2 * | 12/2014 | Sano | H05K 5/0221 | 206/706 |
| 8,962,996 | B2 * | 2/2015 | Imamura | H05K 5/0217 | 174/50 |
| 9,507,382 | B2 * | 11/2016 | Lee | G06F 1/1656 | |
| 9,699,926 | B2 * | 7/2017 | Hwang | B05D 3/144 | |
| 9,930,799 | B2 * | 3/2018 | Moon | H04M 1/18 | |
| 10,244,642 | B2 * | 3/2019 | Suzuki | H05K 5/0052 | |
| 12,075,570 | B2 * | 8/2024 | Kim | H01M 50/262 | |
| 2005/0062372 | A1 * | 3/2005 | Mukougawa | H05K 5/15 | 312/223.1 |
| 2006/0083007 | A1 | 4/2006 | Haugaard et al. | | |
| 2007/0274054 | A1 * | 11/2007 | Lu | H04M 1/0262 | 361/727 |
| 2012/0013792 | A1 * | 1/2012 | Shibata | G03B 11/043 | 348/376 |
| 2012/0217174 | A1 * | 8/2012 | Ting | G06F 1/1628 | 206/45.2 |
| 2012/0308865 | A1 * | 12/2012 | Kim | H01M 50/296 | 429/100 |
| 2012/0327572 | A1 * | 12/2012 | Peng | H04M 1/0249 | 361/679.01 |
| 2013/0170160 | A1 | 7/2013 | Sano | | |
| 2015/0062800 | A1 * | 3/2015 | Cariker | G11B 33/025 | 361/679.34 |
| 2015/0282364 | A1 | 10/2015 | Moon et al. | | |
| 2016/0061379 | A1 * | 3/2016 | Watanabe | F16M 11/10 | 224/191 |
| 2019/0243412 | A1 * | 8/2019 | Siddiqui | G06F 1/1601 | |
| 2021/0376520 | A1 * | 12/2021 | Shell | H02G 3/14 | |
| 2023/0073013 | A1 * | 3/2023 | Mann | A63B 71/028 | |
| 2023/0397344 | A1 * | 12/2023 | Meng | H05K 5/0217 | |

FOREIGN PATENT DOCUMENTS

| | | | |
|---|---|---|---|
| JP | 2006217189 | A | 8/2006 |
| JP | 2006332574 | A | 12/2006 |
| JP | 2007190091 | A | 8/2007 |

OTHER PUBLICATIONS

International Search Report (ISR) (and English translation thereof) dated May 9, 2023, issued in International Application No. PCT/JP2023/006405.

Japanese Office Action dated Jun. 10, 2024 (and English translation thereof), issued in counterpart Japanese Application No. 2022-037695.

Japanese Office Action dated Mar. 28, 2024 (and English translation thereof), issued in counterpart Japanese Application No. 2022-037695.

Written Opinion dated May 9, 2023, issued in International Application No. PCT/JP2023/006405.

Australian Office Action dated Apr. 30, 2025, issued in counterpart Australian Application No. 2023231832.

International Preliminary Report on Patentability (IPRP) (and an English language translation thereof) dated Sep. 10, 2024, issued in International Application No. PCT/JP2023/006405.

Extended European Search Report (EESR) dated Feb. 20, 2026, issued in corresponding European Application No. 23766559.1.

* cited by examiner

PRIOR ART

COVER COMPONENT AND ELECTRONIC DEVICE UNIT

TECHNICAL FIELD

The present disclosure relates to a cover component and an electronic device unit.

BACKGROUND ART

There has been known a cover component that protects an electronic device body, such as a scientific electronic calculator (e.g., refer to Patent Literature 1).

This type of cover component may be configured to be attachable to and detachable from an electronic device body by being provided with a hook part(s) that is engageable with and disengageable from a recess(es) of the electronic device body by elastically deforming.

CITATION LIST

Patent Literature

Patent Literature 1: JP 2007-190091 A

SUMMARY OF INVENTION

Technical Problem

However, in the structure in which the hook part engages the recess by being elastically deformed by contacting the electronic device body, the hook part may be worn away by repetition of attachment and detachment of the cover component to and from the electronic device body. When the hook part is worn away, clearance between the hook part and the electronic device body (e.g., the bottom of the recess) may widen, and wobble of the cover component and the electronic device body may become large.

The present disclosure has been conceived in view of the above circumstances, and an object thereof is configuring an electronic device body and its cover component to be suitably attachable to and detachable from one another.

Solution to Problem

In order to achieve the aforementioned object, the present disclosure includes a cover component attachable to and detachable from an electronic device body, including:

- a hook part that stands in a first direction and engages the electronic device body; and
- a protrusion that regulates a position of the electronic device body in the first direction in an attached state in which the cover component is attached to the electronic device body.

Advantageous Effects

According to the present disclosure, an electronic device body and its cover component can be configured to be suitably attachable to and detachable from one another.

DESCRIPTION OF EMBODIMENTS

With reference to FIG. 1 to FIG. 5, an embodiment of the present disclosure will be described.

The embodiment described below is provided with various technically preferred limitations for carrying out the present disclosure. The technical scope of the present disclosure is not limited to the embodiment below or illustrated examples.

Figure 1:
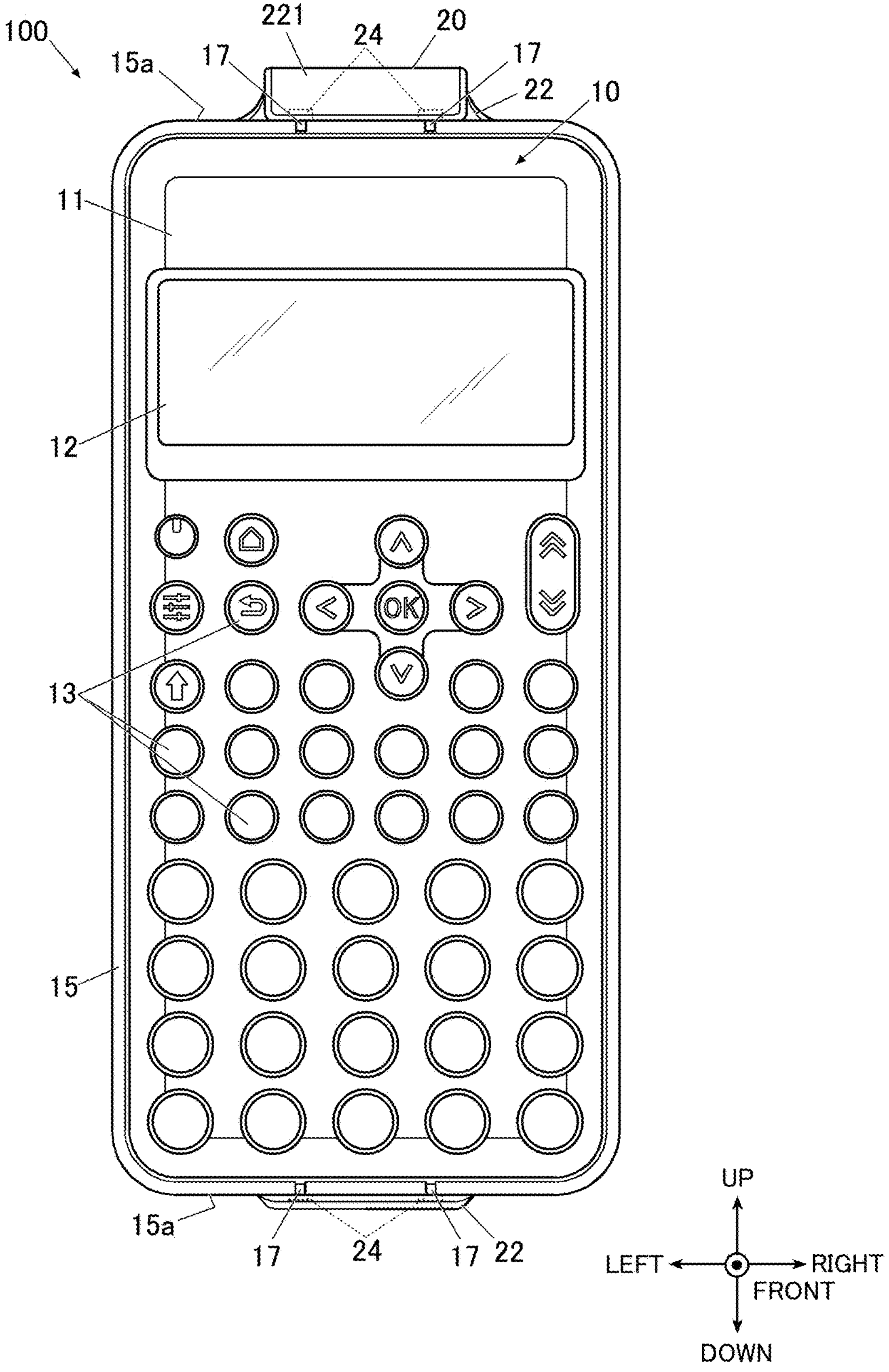
FIG. 1 This is a front view of a scientific electronic calculator unit according to an embodiment.
Figure 2:
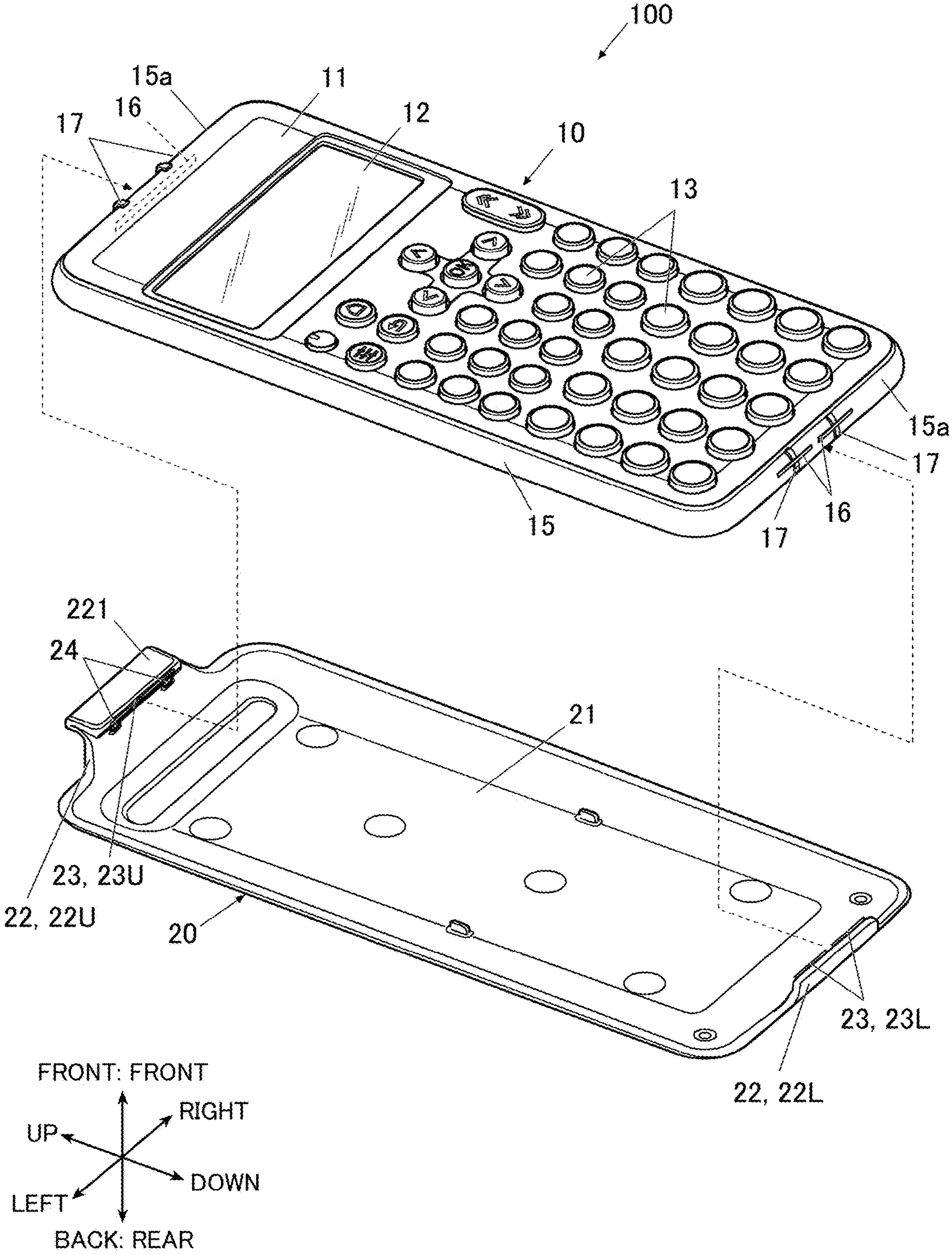
FIG. 2 This is a perspective view of a scientific electronic calculator and a cover component according to the embodiment.

FIG. 1 is a front view of a scientific electronic calculator 10 with a cover component 20 attached (scientific electronic calculator unit 100) according to this embodiment, and FIG. 2 is a perspective view of the scientific electronic calculator 10 and the cover component 20.

Hereinafter, the front, back, left, right, up and down directions refer to orientations shown in the drawings. That is, the front-back direction refers to the front-rear direction (thickness direction) of the scientific electronic calculator 10 and the cover component 20, the left-right direction refers to the width direction of the scientific electronic calculator 10 and the cover component 20, and the up-down direction refers to the longitudinal direction of the scientific electronic calculator 10 and the cover component 20 (i.e., direction in which a display screen 12 and a plurality of operation buttons 13, which are described below, line up).

As described below, the cover component 20 is attachable to both the front side and the rear side of the scientific electronic calculator 10. Hereinafter, however, parts of the cover component 20 will be described as being present in the front-back direction when the cover component 20 has been attached to the rear side of the scientific electronic calculator 10 as shown in FIG. 1 and FIG. 2, unless otherwise noted.

The scientific electronic calculator 10 is an example of the electronic device body of the present disclosure, and, as shown in FIG. 1 and FIG. 2, formed in a rectangular plate shape long in the up-down direction. The scientific electronic calculator 10 is paired with the cover component 20, thereby constituting the scientific electronic calculator unit (electronic device unit) 100.

More specifically, the scientific electronic calculator 10 includes a front case 11 that covers the front face (front face) and a rear case 15 that covers the rear face (back face) and the lateral faces. The front case 11 and the rear case 15 engage one another in the front-back direction such that the front case 11 closes up the opening in the front face of the rear case 15, thereby constituting a housing of the scientific electronic calculator 10.

On the front case 11, the display screen 12 where various types of information are displayed and the operation buttons 13 that receive user operations are arranged.

Although not particularly limited, the rear case 15 is made of high impact polystyrene (HIPS) resin.

The upper and lower lateral faces 15*a* of the rear case 15 are each formed in an arc shape to bulge toward the upper and lower tip sides (toward the outside of the cover component 20), respectively, as their positions get closer to their own centers in the front-back direction (i.e., as their positions get closer to their respective engagement grooves 16 described below). More specifically, each lateral face 15*a* bulges in the opposite direction to the protruding direction of a below-described hook part 23 (alternately referred to herein as an engagement part) corresponding to an engagement groove 16 provided in each lateral face 15*a*.

Each of the upper and lower lateral faces 15*a* is provided with, at substantially the center thereof in the front-back direction, the engagement groove (recess) 16 that catches the below-described hook part 23 of the cover component 20. The engagement grooves 16 are each formed to extend along the left-right direction. Although not particularly limited, the engagement groove 16 formed in the lower lateral face 15*a* is divided into two parts of the left and right parts.

Each of the upper and lower lateral faces 15*a* is provided with two body ribs 17. These two body ribs 17 are arranged at positions in the left-right direction corresponding to the left and right ends of the engagement groove 16. Each body rib 17 runs from the front end to the back end of the lateral face 15*a*, and is formed to straddle the engagement groove 16 and extend in the front-back direction (shown in FIG. 4). In other words, each lateral face 15*a* is provided with four body ribs 17 if each of the two body ribs 17 is regarded as being divided into two parts of the front and back parts by the engagement groove 16. The body ribs 17 on each lateral face 15*a* are arranged at positions in the left-right direction corresponding to ribs 24, which are described below, of the cover component 20.

Each of the upper and lower lateral faces 15*a* (including the body ribs 17) is formed to be symmetrical in the front-back direction with respect to the engagement groove 16 at substantially the center in the front-back direction. This allows the cover component 20 to be attached to and detached from both the front side and the rear side of the scientific electronic calculator 10 in the same manner.

The cover component 20 covers and protects the main face (front face or back face) of the scientific electronic calculator 10, and is configured to be attachable to and detachable from the scientific electronic calculator 10. The cover component 20 is made of, for example, translucent ABS (Acrylonitrile Butadiene Styrene) resin. The cover component 20 is made of a softer (more deformable) material than the rear case 15 of the scientific electronic calculator 10. The cover component 20 has a cover body 21 that covers the main face of the scientific electronic calculator 10.

The cover body 21 is formed in a shape corresponding to the shape of the scientific electronic calculator 10 in front view, namely, a rectangular plate shape long in the up-down direction that corresponds to the longitudinal direction of the scientific electronic calculator 10.

The upper and lower ends of the cover body 21 are provided with extensions 22 (upper extension 22U, lower extension 22L) that are curved and extend frontward. The upper extension 22U has a protruding flat plate part 221 at the front end. The flat plate part 221 is provided to protrude from the front end of the extension 22U upward, and is formed in a substantially flat plate shape perpendicular to the front-back direction. This flat plate part 221 is a part to cancel engagement of (to disengage) the hook part 23, which is described below, when the cover component 20 is removed from the scientific electronic calculator 10 by, for example, its user pressing the front face of the part with his/her thumb, thereby elastically deforming the extension 22U upward.

Hereinafter, components of the upper extension 22U and components of the lower extension 22L may be provided with reference signs with "U" and "L" added at the ends, respectively, to be distinguished from one another.

Figure 3A:
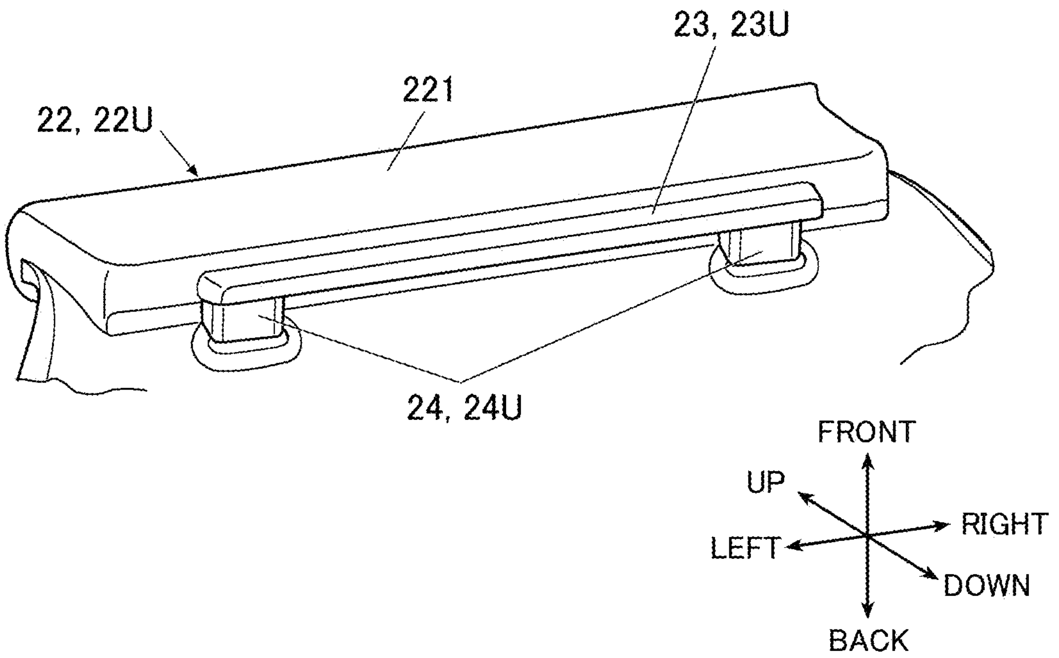
FIG. 3A This is a perspective view of an upper extension.
Figure 3B:
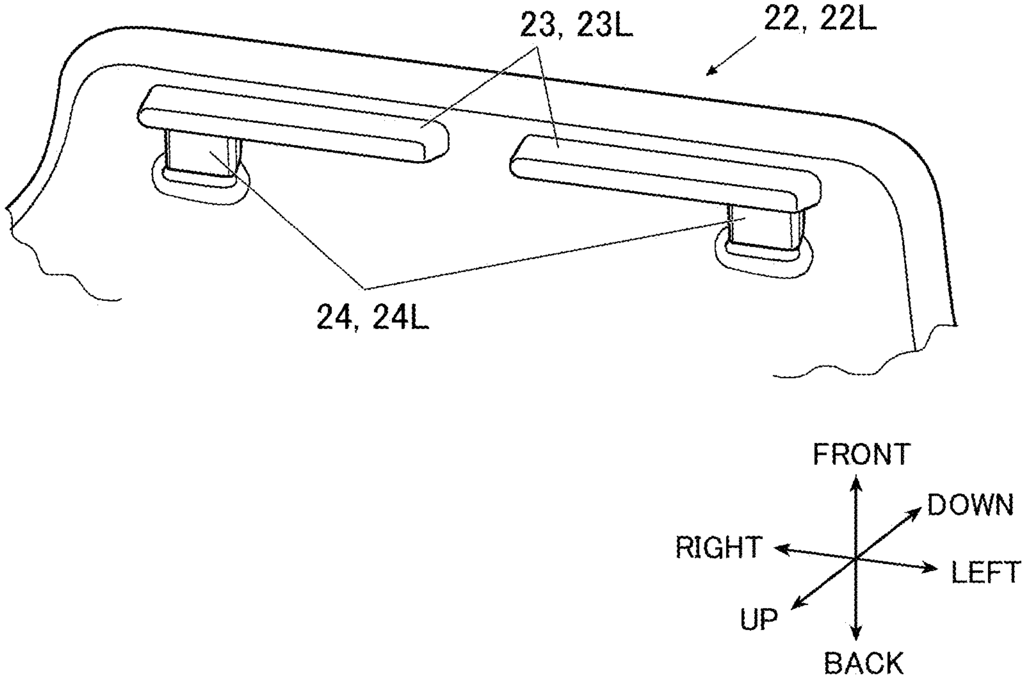
FIG. 3B This is a perspective view of a lower extension.

FIG. 3A is a perspective view of the upper extension 22U. FIG. 3B is a perspective view of the lower extension 22L.

As shown in these drawings, the tip (front end) of each extension 22 is provided with the hook part 23 that stands in the up-down direction (first direction) toward the center of the cover component 20. More precisely, the upper extension 22U is provided with the hook part 23 on the lower face of the flat plate part 221. The hook parts 23 are parts that engage the engagement grooves 16 formed in the upper and lower lateral faces 15*a* of the rear case 15 of the scientific electronic calculator 10 and are formed to extend in the left-right direction to correspond to the engagement grooves 16. The lower hook part 23L is divided into two parts of the left and right parts to correspond to the lower engagement groove 16 of the scientific electronic calculator 10. More specifically, the upper hook part 23U protrudes from the surface of the cover component 20 (surface of the extension 22U) downward, and the lower hook part 23L protrudes from the surface of the cover component 20 (surface of the extension 22L) upward. Like the engagement groove 16 formed in the upper lateral face 15*a*, the engagement groove 16 formed in the lower lateral face 15*a* may not be divided into two parts of the left and right parts. In this case, the hook part 23L may not be divided into two parts of the left and right parts either. The hook parts 23 are formed to be engageable with the engagement grooves 16 of the scientific electronic calculator 10 from both the front side and the rear side. That is, the cover component 20 is attachable to each of the front side and the rear side of the scientific electronic calculator 10 by being reversed in the front-back direction.

At the back side (cover body 21 side where the cover body 21 is provided) of each hook part 23, two ribs 24 are provided adjacent to the hook part 23. These ribs 24 are examples of protrusions of the present disclosure and, as described below, for regulating the position of (positioning) the scientific electronic calculator 10 in the up-down direction in the attached state in which the cover component 20 is attached to the scientific electronic calculator 10 (which is hereinafter simply referred to as "attached state"). The ribs 24 protrude from the surface of the cover component 20 (surfaces of the extensions 22) in the up-down direction. More specifically, the upper ribs 24U protrude downward, and the lower ribs 24L protrude upward. The ribs 24 are arranged to be invisible from the front side (front side) by being covered with the hook parts 23 while supporting the back side of the hook parts 23. The ribs 24 are arranged apart from one another in the left-right direction. More specifically, the ribs 24 are arranged at positions in the left-right direction corresponding to the body ribs 17 formed on each of the upper and lower lateral faces 15*a* of the scientific electronic calculator 10 (shown in FIG. 1).

Figure 4:
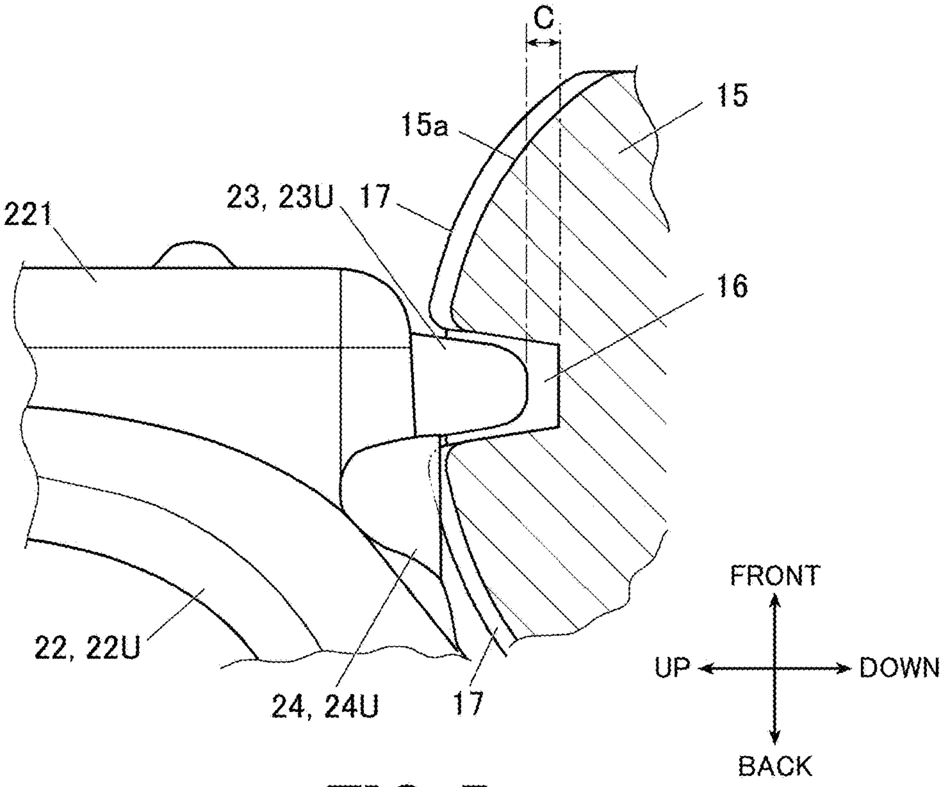
FIG. 4 This is a vertical sectional view of the upper end part of the scientific electronic calculator with the cover component attached to the rear side.

FIG. 4 is a vertical sectional view of the upper end part of the scientific electronic calculator 10 with the cover component 20 attached to the rear side.

In order to attach the cover component 20 to the rear side of the scientific electronic calculator 10, the scientific electronic calculator 10 is pressed into the cover component 20 in the front-back direction in the state in which the scientific electronic calculator 10 and the cover component 20 are stacked in the front-back direction while the front-side parts of the hook parts 23 of the cover component 20 are abutting the rear-side parts of the lateral faces 15*a* of the scientific electronic calculator 10. Then, as shown in FIG. 4, after each extension 22 of the cover component 20 elastically deforms outward in the up-down direction, the hook part 23 of the extension 22 engages the engagement groove 16 of the scientific electronic calculator 10, so that the cover component 20 is attached to the scientific electronic calculator 10.

In this attached state, one face of each rib 24 in the up-down direction closer to the scientific electronic calculator 10 (right face of the rib 24 in FIG. 4) faces the scientific electronic calculator 10, thereby regulating the position of the scientific electronic calculator 10. The state in which each rib 24 "faces" the scientific electronic calculator 10 (body rib 17) includes both the state in which they are in contact with (abut) one another and the state in which they have a gap in between.

In this embodiment, the ribs 24 of the cover component 20 abut the body ribs 17 of the scientific electronic calculator 10 in the state in which the extensions 22 of the cover component 20 have elastically deformed to spread outward in the up-down direction (e.g., each spread 0.1 mm in the up-down direction). FIG. 4 shows, with a dash-dot-dot line, an outline of a portion of the body rib 17 in a state in which the extension 22 of the cover component 20 has not elastically deformed (i.e., a state that does not actually occur), to illustrate an extent to which the rib 24 of the cover component 20 elastically deforms in actual use when contacting with the body rib 17 of the scientific electronic calculator 10. The two extensions 22, namely, the upper and lower extensions 22, of the cover component 20 hold the scientific electronic calculator 10 in between by their elastic force. This makes it possible to properly hold the scientific electronic calculator 10 with no wobble, without, for example, providing the cover body 21 with rubber feet or the like to support the scientific electronic calculator 10.

In order to remove (detach) the cover component 20 from the scientific electronic calculator 10, for example, the user presses the front face of the flat plate part 221 of the upper extension 22U with his/her thumb, which elastically deforms the extension 22U upward to extract the hook part 23U from the engagement groove 16 of the scientific electronic calculator 10. Thus, the cover component 20 can be removed from the scientific electronic calculator 10. Alternatively, by separating the cover component 20 and the scientific electronic calculator 10 from one another in the front-down direction, the back-side walls of the engagement grooves 16 of the scientific electronic calculator 10 press the back faces of the hook parts 23 of the cover component 20, which spreads the extensions 22 outward in the up-down direction and can disengage the hook parts 23 from the engagement grooves 16.

Thus, when the cover component 20 is attached to or detached from the scientific electronic calculator 10, the hook parts 23 of the cover component 20 may rub against the scientific electronic calculator 10, but the ribs 24 are unlikely to rub against the scientific electronic calculator 10. At the time of the attachment/detachment, for example, when the cover component 20 is removed from the scientific electronic calculator 10 by the extensions 22 being spread outward in the up-down direction, depending on the attaching/detaching method, the hook parts 23 may rub against the scientific electronic calculator 10, but the ribs 24 may not rub against the scientific electronic calculator 10. In the attached state of the cover component 20, the cover component 20 and the scientific electronic calculator 10 are positioned (regulated in position) in the up-down direction by the ribs 24 of the cover component 20 being in contact with the upper and lower lateral faces 15*a* (body ribs 17) of the scientific electronic calculator 10. That is, the cover component 20 is positioned with the scientific electronic calculator 10 by the ribs 24, which are different from the hook parts 23 that may be worn away when the cover component 20 is attached to or detached from the scientific electronic calculator 10. Therefore, even if the attachment and the detachment are repeated, the wobble of the cover component 20 and the scientific electronic calculator 10 does not become large, and these can keep being positioned properly.

Figure 5:
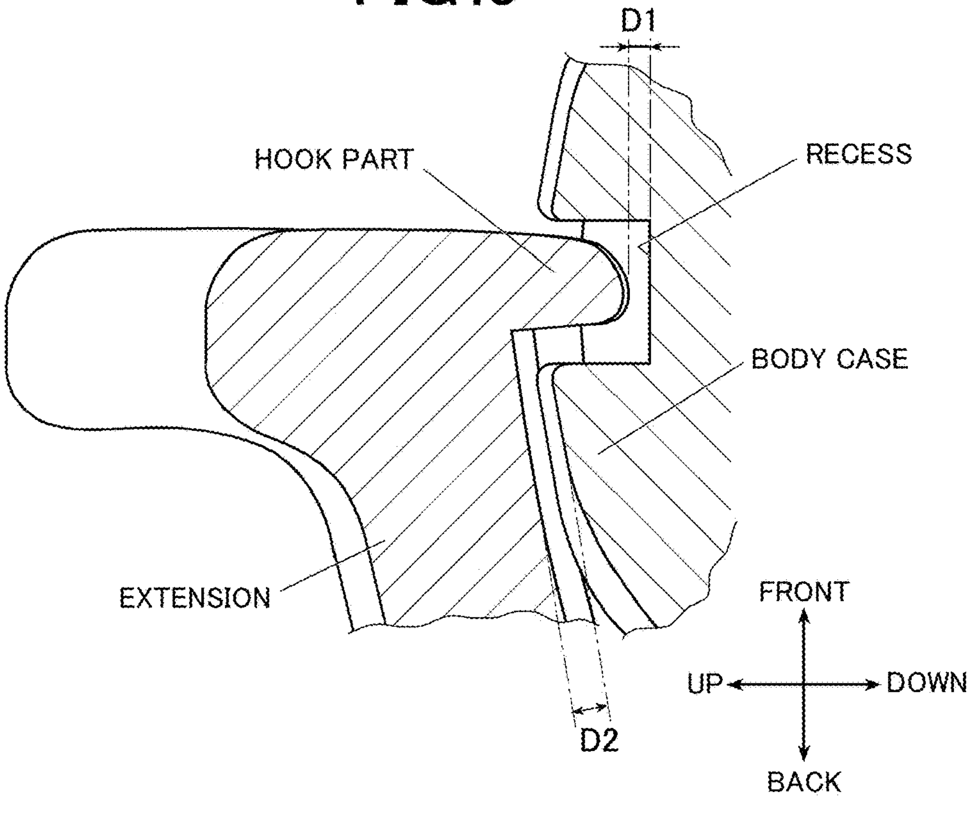
FIG. 5 This shows an attached state of a conventional cover component to a scientific electronic calculator.

That is, in a conventional cover component having no ribs 24, as shown in FIG. 5, a hook part(s) that engages a recess(es) of a scientific electronic calculator (body case) positions the scientific electronic calculator in the up-down direction (standing direction of the hook part), and repetition of the attachment and the detachment wears away the tip face of the hook part and makes the wobble of the cover component and the scientific electronic calculator large. That is, clearance between the cover component and the scientific electronic calculator may widen from the distance D1 between the tip of the hook part, which is originally used for positioning, and the bottom of the recess to the distance D2 between the extension and the lateral face of the body case.

In this regard, in the cover component 20 of this embodiment, the ribs 24, which are different from the hook parts 23 that function as engagement parts with the scientific electronic calculator 10, are in charge of positioning the cover component 20 and the scientific electronic calculator 10, and therefore even if the hook parts 23 are worn away, the ribs 24 can keep positioning the scientific electronic calculator 10 properly.

As described above, the ribs 24 of the cover component 20 and the body ribs 17 of t scientific electronic calculator 10 may not be in contact with (abut) one another but have a gap(s) in between. More specifically, as shown in FIG. 4, in the attached state of the cover component 20, the distance k between the rib 24 and the scientific electronic calculator 10 (body rib 17 in this embodiment) in the up-down direction is shorter than the distance C between the tip of the hook part 23 and the scientific electronic calculator 10 (bottom of the engagement groove 16) in the up-down direction. That is, not the hook parts 23 but the ribs 24 are in the state of being in charge of positioning the cover component 20 and the scientific electronic calculator 10.

Further, in the attached state of the cover component 20, at the opposite side (front side) of the hook parts 23 to the cover body 21 side, the cover component 20 and the scientific electronic calculator 10 have a gap in between. That is, it is preferable that no ribs 24 be present at the front side of the hook parts 23 because if the ribs 24 are present at the front side of the hook parts 23, the ribs 24 and the hook parts 23 are likely to rub at the time of the attachment of the cover component 20. This makes it possible to smoothly attach and detach the cover component 20 to and from the scientific electronic calculator 10.

The positions, quantity and so forth of the ribs 24 are not particularly limited.

For example, only one rib 24 may be provided in the left-right direction. However, it is better to provide a plurality of ribs 24 apart from one another in the left-right direction to stably hold the scientific electronic calculator 10 in the width direction.

Further, although the two extensions 22, namely, the upper and lower extensions 22, are provided with the ribs 24, only one of them may be provided with the ribs 24. In this case, it is preferable that the upper extension 22U having the flat plate part 221 be provided with the ribs 24.

Still further, although the ribs 24 position (regulate the position of) the scientific electronic calculator 10 in its longitudinal direction (up-down direction), the ribs 24 need only regulate the position of the scientific electronic calculator 10 in the standing direction of the hook parts 23. For example, the ribs 24 may position the scientific electronic calculator 10 in its width direction (left-right direction).

Yet further, the relative positions of the ribs 24 and the hook parts 23 are not particularly limited either. The ribs 24 may be arranged at the front side of the hook parts 23. However, if the ribs 24 are adjacent to the back side of the hook parts 23 as in this embodiment, the hook parts 23 and the extensions 22 are unlikely to elastically deform since the ribs 24 support the hook parts 23. This can suppress unintentional separation of the cover component 20 from the scientific electronic calculator 10. Further, in light of both attachment stability and attachability/detachability, it is preferable that the ribs 24 be provided only partly in the width direction of the hook parts 23 (right-left direction). Still further, arranging the ribs 24 at the back side of the hook parts 23 makes it possible to smoothly attach and detach the cover component 20 to and from the scientific electronic calculator 10.

Further, although the body ribs 17 are provided on the rear case 15 of the scientific electronic calculator 10 to correspond to the ribs 24 of the cover component 20, the body ribs 17 may not be provided. However, as compared with a case where the lateral faces 15*a* of the rear case 15 themselves rub against the ribs 24 and are worn away, it is preferable to provide the body ribs 17 especially in terms of aesthetics because worn-away points of the scientific electronic calculator at 10 the time of the attachment/detachment can be the body ribs 17 only.

As described above, according to this embodiment, the cover component 20 attachable to and detachable from the scientific electronic calculator 10 includes the rib(s) 24 that regulates the position of the scientific electronic calculator 10 in the standing direction of the hook part(s) 23 (up-down direction) in the attached state.

Unlike the conventional art, in which a hook part(s) that engages a scientific electronic calculator positions the scientific electronic calculator, the ribs 24, which are different from the hook parts 23 that function as the engagement parts with the scientific electronic calculator 10, are in charge of positioning the cover component 20 and the scientific electronic calculator 10. Therefore, even if the hook parts 23 are worn way, the ribs 24 can keep positioning the scientific electronic calculator 10 properly. Thus, the scientific electronic calculator 10 and its cover component 20 can be configured to be suitably attachable to and detachable from one another.

Further, according to this embodiment, in the attached state of the cover component 20, one face of the rib 24 faces the scientific electronic calculator 10 and regulates the position thereof.

That is, since only one face of each rib 24 faces (in this embodiment, is in contact with) the lateral face 15*a* of the scientific electronic calculator 10, and, unlike the hook parts 23, the ribs 24 are not covered with the recesses (engagement grooves 16), wear of the ribs 24 at the time of the attachment/detachment can be suppressed.

Further, according to this embodiment, in the attached state of the cover component 20, the distance between the rib 24 and the scientific electronic calculator 10 (body rib 17 in this embodiment) in the up-down direction is shorter than the distance C between the tip of the hook part 23 and the scientific electronic calculator 10 (bottom of the engagement groove 16) in the up-down direction.

This allows the scientific electronic calculator 10 to be positioned in the up-down direction more reliably by not the hook parts 23 but the ribs 24.

Further, according to this embodiment, the rib 24 is provided adjacent to the cover body 21 side (back side) of the hook part 23.

This allows the ribs 24 to be arranged to be invisible from the front side by being covered with the hook parts 23 and therefore not to impair the aesthetics.

Further, according to this embodiment, the ribs 24 are provided apart from one another in the left-right direction perpendicular to the up-down direction and the thickness direction of the cover component 20.

This allows the scientific electronic calculator 10 to be stably held in the left-right direction (width direction).

Further, according to this embodiment, the cover component 20 is made of a softer (more deformable) material than, of the scientific electronic calculator 10, the rear case 15 that the hook part 23 engages.

This can suppress deformation and wear of the scientific electronic calculator 10 (rear case 15) due to the attachment/detachment of the cover component 20 to/from the scientific electronic calculator 10.

It goes without saying that embodiments to which the present disclosure is applicable are not limited to the embodiment described above, and various modifications can be made without departing from the scope of the present disclosure.

For example, the cover component 20 may not be the attachable/detachable type of being attachable to and detachable from the scientific electronic calculator 10 but a sliding type of being attachable to the front side or the rear side of the scientific electronic calculator 10 by sliding on the main face of the scientific electronic calculator 10.

Further, the electronic device (body) of the present disclosure is not limited to the scientific electronic calculator (electronic calculator) but widely applicable to electronic devices in general to and from which cover components are attachable and detachable, such as an electronic dictionary and a smartphone.

Although some embodiments of the present disclosure have been described above, the scope of the present disclosure is not limited to the embodiments described above but includes the scope of the disclosure described in claims and the scope of equivalents thereof.

INDUSTRIAL APPLICABILITY

The present disclosure is, for example, for suitably attaching and detaching an electronic device body and its cover component to and from one another, and accordingly applicable to a cover component and an electronic device unit.

REFERENCE SIGNS LIST

10 Scientific Electronic Calculator (Electronic Device Body)
11 Front Case
15 Rear Case (Case)
15*a* Lateral Face
16 Engagement Groove (Recess)
17 Body Rib
20 Cover Component
21 Cover Body
22 Extension

23 Hook Part
24 Rib (Protrusion)
100 Scientific Electronic Calculator Unit (Electronic Device Unit)
C Distance (Distance between Tip of Hook Part and Scientific Electronic Calculator in Up-Down Direction)

The invention claimed is:

1. A cover component attachable to and detachable from an electronic device body, the cover component comprising:
an engagement part that stands in a first direction and is engageable with a recess provided in a lateral face of the electronic device body; and
a protrusion that regulates a position of the electronic device body in the first direction by contact between the protrusion and a rib when the cover component is attached to the electronic device body, the rib being provided on the lateral face of the electronic device body adjacent to the recess,
wherein the protrusion is provided at, from among respective sides of the engagement part in a direction corresponding to a thickness direction of the electronic device body, only a side of the engagement part that is closer to a cover body of the cover component, and
wherein the thickness direction is a direction substantially perpendicular to the first direction.

2. The cover component according to claim 1, wherein the protrusion protrudes from a surface of the cover component to one side in the first direction, and is provided adjacent to the engagement part to have a protruding height lower than a protruding height of the engagement part.

3. The cover component according to claim 1, wherein the first direction is a direction corresponding to a longitudinal direction of the electronic device body.

4. The cover component according to claim 1, wherein the engagement part extends in a second direction, and
wherein the protrusion comprises a plurality of protrusions, each of the protrusions being shorter than the engagement part in the second direction and being provided along the engagement part.

5. The cover component according to claim 4, wherein two of the protrusions are provided, each of the two protrusions being provided at one of respective end sides of the engagement part in the second direction so as to be apart from one another.

6. An electronic device unit comprising:
the cover component according to claim 1; and
the electronic device body to and from which the cover component is attachable and detachable.

7. The electronic device unit according to claim 6, wherein the lateral face in which the recess is provided has a curved shape which bulges as the lateral face gets closer to the recess in a thickness direction of the electronic device body, and
wherein a direction in which the lateral face bulges is opposite to a direction in which the engagement part protrudes.

8. The electronic device unit according to claim 6, wherein the recess is a groove extending in a second direction.

9. The electronic device unit according to claim 6, wherein the cover component further comprises an extension provided with the engagement part and the protrusion, and
wherein when the cover component is attached to the electronic device body, a biasing force to one side in the first direction acts on the extension, and the protrusion abuts the rib.

10. The electronic device unit according to claim 9, wherein in a state in which the cover component is attached to the electronic device body and the protrusion abuts the rib, a reaction force from the rib to another side in the first direction acts on the extension, and the extension elastically deforms to the another side in the first direction.

11. A cover component attachable to and detachable from an electronic device body, the cover component comprising:
an engagement part that stands in a first direction and is engageable with a recess provided in a lateral face of the electronic device body; and
a protrusion that regulates a position of the electronic device body in the first direction by contact between the protrusion and a rib when the cover component is attached to the electronic device body, the rib being provided on the lateral face of the electronic device body adjacent to the recess,
wherein the cover component further comprises an extension provided with the engagement part and the protrusion, and
wherein when the cover component is attached to the electronic device body, a biasing force to one side in the first direction acts on the extension, and the protrusion abuts the rib.

12. The electronic device unit according to claim 11, wherein in a state in which the cover component is attached to the electronic device body and the protrusion abuts the rib, a reaction force from the rib to another side in the first direction acts on the extension, and the extension elastically deforms to the another side in the first direction.

* * * * *